(12) United States Patent
Chen

(10) Patent No.: US 12,446,200 B2
(45) Date of Patent: Oct. 14, 2025

(54) DISPLAY MODULE AND TERMINAL DEVICE

(71) Applicant: WUHAN CHINA STAR OPTOELECTRONICS SEMICONDUCTOR DISPLAY TECHNOLOGY CO., LTD., Hubei (CN)

(72) Inventor: Yongsheng Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/247,604

(22) PCT Filed: Feb. 28, 2023

(86) PCT No.: PCT/CN2023/078889
§ 371 (c)(1),
(2) Date: Mar. 31, 2023

(87) PCT Pub. No.: WO2024/016672
PCT Pub. Date: Jan. 25, 2024

(65) Prior Publication Data
US 2025/0142798 A1     May 1, 2025

(30) Foreign Application Priority Data
Jul. 20, 2022   (CN) .......................... 202210857750.5

(51) Int. Cl.
*G09F 9/30*     (2006.01)
*G09F 9/33*     (2006.01)
*H05K 9/00*     (2006.01)

(52) U.S. Cl.
CPC .......... *H05K 9/009* (2013.01); *H05K 9/0054* (2013.01)

(58) Field of Classification Search
CPC . G09F 9/301; G09F 9/335; G09F 9/30; G09F 9/33; H05K 9/0081; H05K 9/009; H05K 9/00; H09K 9/0054
(Continued)

(56) References Cited

U.S. PATENT DOCUMENTS

| | | |
|---|---|---|
| 2018/0090698 A1 | 3/2018 | Jeong et al. |
| 2019/0001461 A1* | 1/2019 | Klein ....................... B24B 33/02 |
| 2023/0132305 A1* | 4/2023 | Nishiwaki ............ C08K 5/0041 |
| | | 428/355 AC |

FOREIGN PATENT DOCUMENTS

| | | | |
|---|---|---|---|
| CN | 103232820 A | 8/2013 | |
| CN | 111103617 A * | 5/2020 | ............... G01T 3/00 |

(Continued)

OTHER PUBLICATIONS

International Search Report in International application No. PCT/CN2023/078889,mailed on Apr. 28, 2023.
(Continued)

*Primary Examiner* — Timothy J Thompson
*Assistant Examiner* — Guillermo J Egoavil
(74) *Attorney, Agent, or Firm* — PV IP PC; Wei Te Chung

(57) ABSTRACT

Examples of the present disclosure disclose a display module and a terminal device. The display module includes a support layer, a backplane, and a display panel, wherein the display panel is disposed on one side of the backplane away from the support layer. The support layer includes a composite material layer which plays a supporting role, and the composite material layer includes at least a resin matrix and a fiber material. The weight of the support layer is reduced
(Continued)

by preparing the composite material layer from a composite material with a density less than that of a SUS material.

20 Claims, 4 Drawing Sheets

(58) Field of Classification Search
USPC .......................................................... 361/816
See application file for complete search history.

(56) References Cited

FOREIGN PATENT DOCUMENTS

| | | | | |
|---|---|---|---|---|
| CN | 111477123 A | 7/2020 | | |
| CN | 112885244 A | 6/2021 | | |
| CN | 113112917 A * | 7/2021 | ............. | G09F 9/301 |
| CN | 114078942 A | 2/2022 | | |
| CN | 216353073 U * | 4/2022 | ............... | G01F 9/30 |
| CN | 114495741 A | 5/2022 | | |
| CN | 114664180 A | 6/2022 | | |
| CN | 114694512 A | 7/2022 | | |
| CN | 115274791 A | 11/2022 | | |
| WO | 2020073745 A1 | 4/2020 | | |

OTHER PUBLICATIONS

Written Opinion of the International Search Authority in International application No. PCT/CN2023/078889, mailed on Apr. 23, 2023.
Chinese Office Action issued in corresponding Chinese Patent Application No. 202210857750.5 dated Nov. 13, 2024, pp. 1-6.
Chinese Office Action issued in corresponding Chinese Patent Application No. 202210857750.5 dated May 14, 2024, pp. 1-7.

* cited by examiner

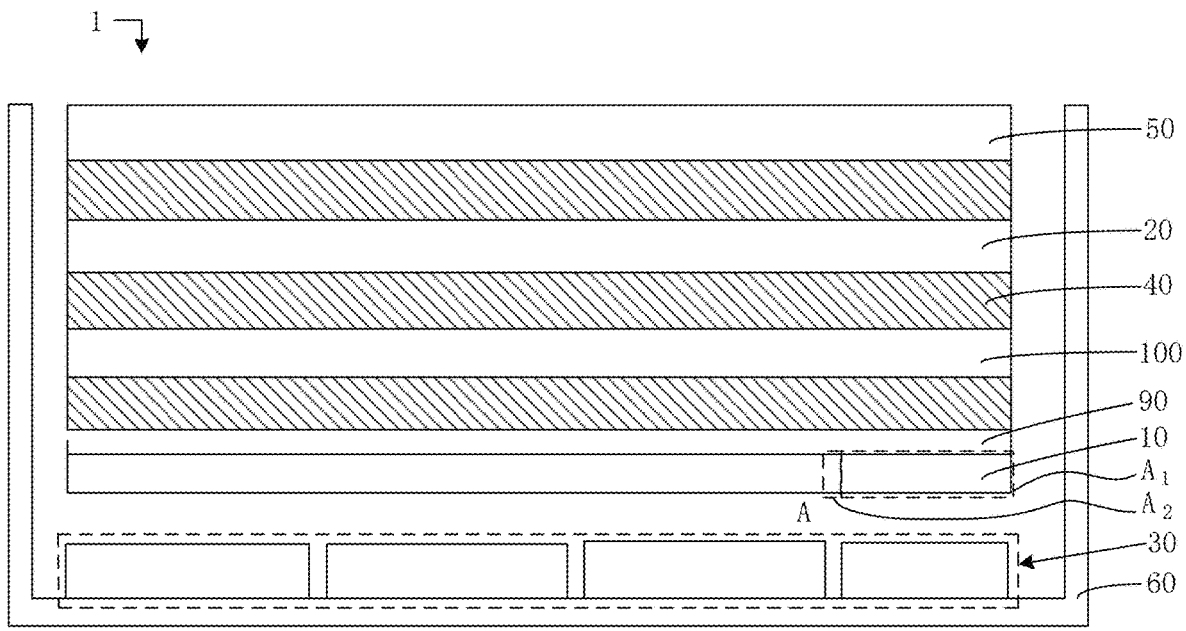

FIG. 7

```
┌─────────────────────────────────────────────────────────────┐
│ Uniformly mixing particles having high electromagnetic       │
│ shielding materials and molding auxiliary agents in a resin  │─── S1
│ by mechanical stirring to prepare a resin containing the     │
│ electromagnetic shielding materials                          │
└─────────────────────────────────────────────────────────────┘
                              │
                              ▼
┌─────────────────────────────────────────────────────────────┐
│ Preparing fiber composite materials according to a commonly  │─── S2
│ used preparation process of fiber composite materials        │
└─────────────────────────────────────────────────────────────┘
```

FIG. 8

DISPLAY MODULE AND TERMINAL DEVICE

TECHNICAL FIELD

The present disclosure relates to a technical field of display, and in particular, to a display panel and a terminal device.

BACKGROUND

Organic light-emitting diode (OLED) display devices are widely used due to the advantages of self-luminescence, flexibility, or the like. With the increasing integration and signal transmission density of smart phones in 5G era, spacing between chips inside the smartphone becomes smaller and smaller, and the electromagnetic interference inside the smartphone becomes more and more serious. The electromagnetic field generated by devices is easy to interfere with the display layer, and there are abnormalities such as screen flashing or image shift and upside down. Existing OLED display devices will use stainless steel or nickel-plated stainless steel plates as flexible support layers, and its electromagnetic shielding ability is difficult to meet the increasing requirements, and the stainless steel plates are heavy.

Therefore, existing display modules have a technical problem that the support layer is heavy.

SUMMARY

Examples of the present disclosure provide a display module and a terminal device, which can alleviate the technical problem that an existing display module has a heavy support layer.

Examples of the present disclosure provide a display module, which comprises a support layer, a backplane and a display panel, wherein the backplane is disposed above the support layer, the display panel is disposed on one side of the backplane away from the support layer, the support layer comprises a composite material layer that acts as a support, the composite material layer is prepared from a composite material, and the composite material comprises at least a resin matrix and a fiber material.

Optionally, in some examples of the present disclosure, the composite material has a density of less than 7.8 g/cm$^3$.

Optionally, in some examples of the present disclosure, the composite material has a tensile strength greater than or equal to that of a steel used stainless (SUS) material.

Optionally, in some examples of the present disclosure, the fiber material is at least one of a glass fiber material and a carbon fiber composite material.

Optionally, in some examples of the present disclosure, the composite material layer is doped with an electromagnetic shielding material.

Optionally, in some examples of the present disclosure, the composite material layer is further doped with other functional materials comprising at least one of a light blocking material, a heat insulating material, a stress buffering material, and a crack conduction blocking material.

Optionally, in some examples of the present disclosure, the electromagnetic shielding material is a material with a shielding effect superior to that of nickel.

Optionally, in some examples of the present disclosure, the electromagnetic shielding material comprises at least one of a ferrite powder, a carbonyl iron powder, a carbon black, and a nickel powder.

Optionally, in some examples of the present disclosure, the support layer further comprises a film layer having at least one function of blocking light, insulating heat, buffering stress, and blocking crack conduction.

Optionally, in some examples of the present disclosure, the support layer further comprises an electromagnetic shielding layer disposing on one side of the composite material layer.

Optionally, in some examples of the present disclosure, the support layer comprises a bending region and a non-bending region, and the composite material layer in the bending region is provided with a plurality of groove with a depth less than or equal to a thickness of the composite material layer.

Optionally, in some examples of the present disclosure, the bending region comprises a bending center-line, and a density of the grooves disposed in a region close to the bending center-line is greater than a density of the grooves disposed in a region close to the non-bending region.

Optionally, in some examples of the present disclosure, a material of the lap layer comprises copper, aluminum, silver, or a metal alloy.

Optionally, in some examples of the present disclosure, a spacing distance between adjacent grooves can be increased in a direction from the bending center-line toward the non-bending region.

Optionally, in some examples of the present disclosure, the groove is filled with a buffering material having a flexibility greater than that of the composite material.

Optionally, in some examples of the present disclosure, the support layer further comprises a plasma-contact layer disposed on one side of the composite material layer close to the display panel, and/or on another side of the composite material layer away from the display panel.

Optionally, in some examples of the present disclosure, the support layer faces towards one side of the display panel, and/or the support layer faces away from one side of the display panel and at least one side of the support layer is configured as a roughened surface.

Optionally, in some examples of the present disclosure, a thickness of the support layer ranges from 100 microns to 200 microns.

Optionally, in some examples of the present disclosure, the support layer further comprises a SUS layer disposed in a stacked manner with the composite material layer.

Examples of the present disclosure further provide a terminal device comprising a display module according to any one of the above examples and an electronic component layer disposed on one side of the support layer away from the display panel, wherein the support layer comprises a composite material layer that acts as a support, the composite material layer is prepared from a composite material, and the composite material comprises at least a resin matrix and a fiber material.

Optionally, in some examples of the present disclosure, the composite material layer comprises a first region corresponding to the electronic component layer in a film thickness direction, and a second region not corresponding to the electronic component layer, wherein a doping concentration of the electromagnetic shielding material in the first region is greater than a doping concentration of the electromagnetic shielding material in the second region.

Technical Effects

Compared with support layer prepared from a SUS material, support layer in the present disclosure is prepared from a composite material with a density smaller than that of the SUS material, the weight of the support layer is reduced, and the technical problem that existing display module has a greater weight of support layer is alleviated.

BRIEF DESCRIPTION OF THE DRAWINGS

In order to more clearly describe the technical solutions in examples of the present disclosure, hereinafter, the appended drawings used for describing the examples will be briefly introduced. Apparently, the appended drawings described below are only directed to some examples of the present disclosure, and for a person skilled in the art, without expenditure of creative labor, other drawings can be derived on the basis of these appended drawings.

FIG. 7 is a second cross-sectional schematic view of a terminal device according to the present disclosure;

FIG. 8 is a flowchart of a method for preparing a support layer according to the present disclosure;

DESCRIPTION OF REFERENCE NUMBERS

Figure 1:
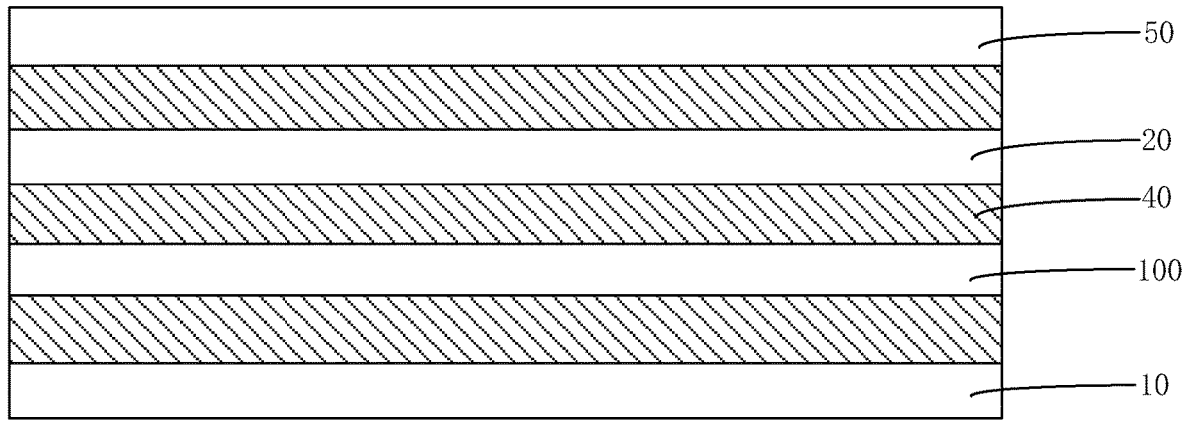
FIG. 1 is a cross-sectional schematic view of a display module according to the present disclosure.

| Reference number | Name of components | Reference number | Name of components |
| --- | --- | --- | --- |
| 1 | Terminal device | 10 | Support layer |
| 20 | Display panel | 30 | Electronic component layer |
| 40 | Optical adhesive | 50 | Cover plate |
| 60 | Intermediate frame | 101 | Composite material layer |
| 102 | Electromagnetic shielding material | 103 | Electromagnetic shielding material layer |
| 70 | Bending region | 80 | Non-bending region |
| 90 | Plasma-contact layer | 100 | PET base plate |

Detailed Description

Hereinafter, technical solutions in examples of the present disclosure will be clearly and completely described with reference to the accompanying drawings in examples of the present disclosure. Apparently, the described examples are part of, but not all of, the examples of the present disclosure. All the other examples, obtained by a person with ordinary skill in the art on the basis of the examples in the present disclosure without expenditure of creative labor, belong to the protection scope of the present disclosure. In addition, it should be understood that specific embodiments described herein are only used to illustrate and explain the present disclosure, and are not intended to limit the present disclosure. In the present disclosure, unless otherwise stated, orientation words such as "up" and "down" generally refers to "up" and "down" in the actual use or working state of a device, and specifically refers to the drawing direction in the drawings; while "inside" and "outside" refer to outline of a device.

With reference to FIG. 1, a display module provided herein includes a support layer, a backplane and a display panel, wherein the backplane is disposed above the support layer, and the display panel is disposed on one side of the backplane away from the support layer. The support layer comprises a composite material layer that acts as a support, and the composite material layer is prepared from a composite material comprising at least a resin matrix and a fiber material.

The composite material has a density of less than 7.8 g/cm$^3$.

The support layer 10 may be a flexible support layer.

It can be understood that a SUS material has a density of 7.8 g/cm$^3$ under normal circumstances. Compared with composite material layer 101 prepared from a SUS material, the weight of the support layer 10 can be effectively reduced by using a composite material with a smaller density than the SUS material.

It should be noted that the composite material also needs to meet some other performance requirements to ensure that the function and use of the support layer 10 are not affected. Said some other properties include, but are not limited to, tensile strength, elastic modulus and cost.

In this example, the weight of the support layer 10 is reduced by using a composite material with a density smaller than that of a SUS material and some other properties similar to those of a SUS material, thereby reducing the weight of the display module as a whole.

The technical solutions of the present disclosure will now be described in conjunction with specific examples.

As shown in the following table, the density, tensile strength, elastic modulus and cost of a SUS material, a carbon fiber composite material and a glass fiber composite material are compared.

| Material | Density (g/cm$^3$) | Tensile Strength (GPa) | Elastic modulus (GPa) | Cost |
| --- | --- | --- | --- | --- |
| SUS | 7.8 | 1.03 | 200 | 100% |
| Carbon fiber composite material | 1.5 | 1.50 | 140 | 3000% |
| Glass fiber composite material | 2.0 | 1.06 | 80 | 120% |

In an example, the composite material has a tensile strength greater than or equal to that of a SUS material.

The tensile strength of a SUS material is 1.03 GPa.

The composite material may be a glass fiber composite material, and the fiber material is a glass fiber material, wherein the glass fiber composite material with a tensile strength of 1.06 GPa.

The composite material may also be a carbon fiber composite material with a tensile strength of 1.5 GPa.

It can be understood that the tensile strength of the composite material may be greater than or equal to 1.03 GPa, and that the support layer 10 prepared from the composite material has better bending stress resistance effect than that prepared from the SUS material, and is not prone to abnormalities such as fractures during bending.

It can be understood that the tensile strength of the carbon fiber composite material is improved more obvious than that of the glass fiber composite material. In some scenarios where higher tensile strength is needed, a carbon fiber composite material can be used to improve the tensile strength and avoid abnormalities such as fractures caused by stress.

In this example, abnormalities such as fractures or cracks of the support layer 10 occurring in the bending state is alleviated by limiting the tensile strength of the composite material.

In an example, the elastic modulus of the composite material is greater than or equal to 80.

The elastic modulus of the carbon fiber composite material is 140 GPa.

The elastic modulus of the glass fiber composite material is 80 GPa.

It can be understood that the elastic modulus of the SUS material is 200 GPa, and that the larger the elastic modulus, the better the supporting effect. However, for a composite material, such as a glass fiber composite material, although its elastic modulus is reduced to 80 GPa, according to the experimental verification, 80 GPa is enough to provide supporting and protecting effect required by a display module in a terminal device 1.

In this example, the composite material satisfies the supporting and protecting effect required by a display module, and functions of the support layer 10 will not be affected by using the composite material.

In an example, the composite material layer 101 is prepared from a glass fiber composite material.

The cost of the glass fiber composite material is lower than that of the carbon fiber composite material.

Since a glass fiber composite material is similar to SUS in mechanical strength, it may also be called a glass fiber reinforced plastic.

It can be understood that a glass fiber compound board has a low density and a high strength, which can effectively realize thinning of display equipment while supporting and protecting the whole display module.

It should be noted that the cost price of the carbon fiber composite material is about 25 times that of the glass fiber composite material. Therefore, the cost can be greatly reduced by using the glass fiber composite material, and the bending resistance and the supporting effect of the support layer 10 can also be satisfied.

It should be noted that the cost price of the glass fiber composite is similar to that of a SUS material, therefore, replacing SUS material with the glass fiber composite material will not increase the cost. Specifically, a ratio of the cost price of the glass fiber composite material to that of the SUS material is about 1.2:1.

In this example, compared with the carbon fiber composite material, the cost can be further reduced by using the glass fiber composite material as a material for preparing the composite material layer 101.

In an example, the support layer 10 in the bending region 70 may be prepared from a carbon fiber composite material, and the support layer 10 in the non-bending region 80 may be prepared from a glass fiber composite material.

In this example, not only the ability to buffer stress it the bending region 70 is greatly improved, but also the cost of the support layer 10 is controlled, which alleviates the problem of sharp increase in cost caused by disposing the whole support layer 10 as carbon fiber composite materials.

Figure 2:
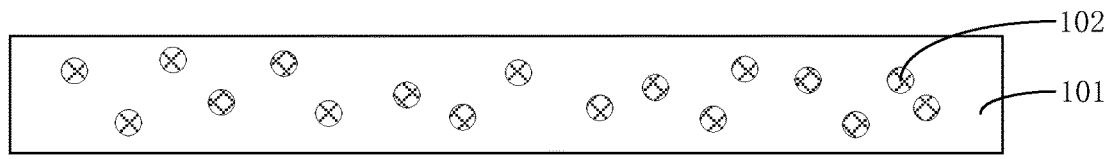
FIG. 2 is a first cross-sectional schematic view of a support layer according to the present disclosure.

In an example, with reference to FIG. 2, the composite material layer 101 is doped with an electromagnetic shielding material 102.

It can be understood that, in order to make the support layer 10 to have other functions, such as an electromagnetic shielding function, an electromagnetic shielding material 102 may be doped in the composite material layer 101, or an electromagnetic shielding layer 103 may be disposed on one side of the composite material layer 101, both of which can realize electromagnetic shielding function. Compared with disposing an electromagnetic shielding layer 103, doping an electromagnetic shielding material 102 not only can reduce the overall film thickness of the support layer 10, but also low the cost.

It should be noted that the composite material layer 101 may be doped not only with the electromagnetic shielding material 102, but also with other functional materials, so that the composite material layer 101 can not only act as a support, but also realize other functions, including light blocking, heat insulating, stress buffering, crack blocking, or the like, which are specifically determined according to application scenarios and requirements of the support layer 10, and are not specifically limited herein.

In this example, the composite material layer 101 not only acts as a support, but also has an electromagnetic shielding function by doping the electromagnetic shielding material 102 therein, thus reducing the cost.

In an example, the electromagnetic shielding material 102 includes at least one of a ferrite powder, a carbonyl iron powder, a carbon black, and a nickel powder.

Further, it has a better shielding effect by doping the electromagnetic shielding material 102 including at least one of a ferrite powder, a carbonyl iron powder, a carbon black, and a nickel powder than disposing an electromagnetic shielding layer 103 prepared from nickel powder or plating nickel.

In this example, the electromagnetic shielding effect of the support layer 10 can be improved by defining the electromagnetic shielding material 102 as a material with a shielding effect superior to that of nickel.

In an example, the support layer 10 further includes a functional film layer having at least one function of blocking light, insulating heat, buffering stress, and blocking crack conduction.

Figure 3:
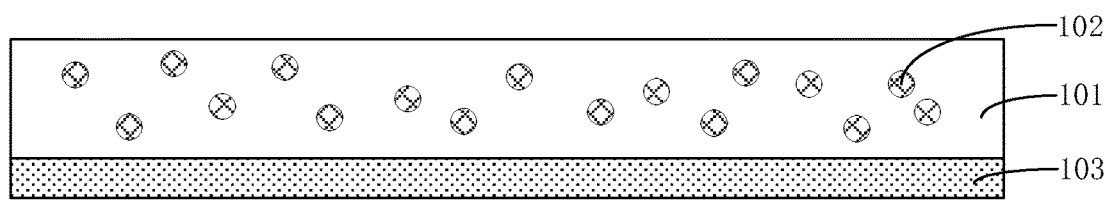
FIG. 3 is a second cross-sectional schematic view of a support layer according to the present disclosure.

In an example, with reference to FIG. 3, the support layer 10 further includes an electromagnetic shielding layer 103 disposing on one side of the composite material layer 101.

Figure 4:
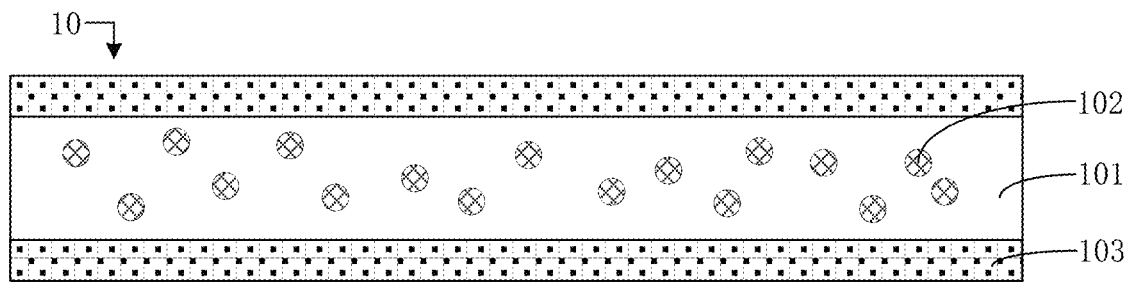
FIG. 4 is a third cross-sectional schematic view of a support layer according to the present disclosure.

With reference to FIG. 4, the electromagnetic shielding layer 103 may be disposed on both sides of the composite material layer 101 along light emitting direction, thereby improving the electromagnetic shielding effect.

It can be understood that, an electromagnetic shielding layer 103 can be disposed on one side or both sides of the composite material layer 101 along the light emitting direction at the same time of doping an electromagnetic shielding material 102 in the composite material layer 101, thereby further improving the electromagnetic shielding effect.

It should be noted that a material for preparing the electromagnetic shielding layer 103 may include at least one of a ferrite powder, a carbonyl iron powder, a carbon black, and a nickel powder on the premise that the process is satisfied.

In this example, the electromagnetic shielding effect of the support layer 10 is improved by disposing an electromagnetic shielding layer 103 on one side or both sides of the composite material layer 101 along the light emitting direction.

In an example, the support layer 10 includes a stress buffering structure for enhancing the stress buffering ability of the support layer 10.

The stress cushioning structure may be a groove or a protrusion.

Figure 5:
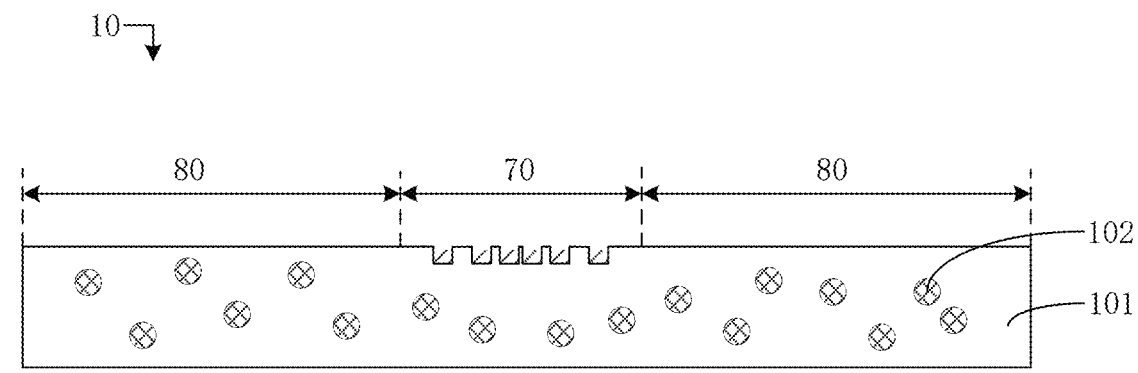
FIG. 5 is a fourth cross-sectional schematic view of a support layer according to the present disclosure.

In an example, with reference to FIG. 5, the support layer 10 includes a bending region 70 and a non-bending region 80. The composite material layer 101 in the bending region 70 is provided with at least one groove with a depth less than or equal to a thickness of the composite material layer 101.

The grooves may be disposed in an array arrangement.

The bending region 70 includes a bending centerline, and a density of the grooves disposed in a region close to the bending center line is greater than a density of the grooves disposed in a region close to the non-bending region 80.

A spacing distance between adjacent grooves can be increased in a direction from the bending center line toward the non-bending region 80.

It can be understood that the grooves may also be disposed in a region of the non-bending region 80 close to the bending region 70, thereby enhancing the stress buffering capacity of regions of the non-bending region 80 close to the bending region 70.

In this example, the bending stress resistance of the support layer 10 can be improved by disposing grooves in the bending region 70 of the support layer 10.

In an example, sizes or depths of the grooves may be different.

Depths of the grooves close to the bending center line may be larger than depths of the grooves away from the bending centerline.

Sizes of the grooves near the bending center line may be larger than sizes of the grooves away from the bending centerline.

It can be understood that the greater the depths or sizes of the grooves, the better the effect of relieving the bending stress. For regions near the bending center line that are subjected to more bending stress, the bending stress at position of the bending center line can be relieved better by disposing grooves with greater depths or sizes.

It should be noted that it is not limited to disposing grooves with greater depths, sizes, and densities in regions near the bending centerline. According to actual requirements, when a certain region is greatly affected by bending stress, a solution of differentially disposing grooves can be adopted to better alleviate the bending stress in this region, and to improve the uniformity of stress in each region at the same time.

In this example, the grooves in different regions are designed differently, thus for a region greatly affected by bending stress, it can better alleviate the bending stress in this region and prevent some regions from being abnormal due to uneven stress in each region.

In an example, the groove is filled with a buffering material having a flexibility greater than that of the composite material.

The buffering material may be polyurethane.

It can be understood that flexibility refers to the ability of a material to absorb energy during plastic deformation and fracture, the greater the flexibility, the less likely brittle fracture occurs.

In this example, the buffering ability of the support layer 10 is further improved by filling the grooves with a buffering material with flexibility greater than that of the composite material.

In an example, one or both sides of the support layer 10 are disposed as roughened surface(s).

In this example, one or both sides of the support layer 10 are disposed as roughened surface(s), so that the bonding force between the support layer 10 and other film layers is increased, thereby preventing the film layers from peeling off or falling off.

In an example, the support layer 10 further includes a plasma-contact layer 90 disposed on one or both sides thereof for increasing the bonding force between the support layer 10 and other membrane layers.

In an example, the thickness of the support layer 10 ranges from 100 microns to 200 microns.

It can be understood that the support layer 10 in the prior art includes two layers: a SUS layer and an electromagnetic shielding layer 103. However, the support layer 10 disclosed in the present disclosure may include only one composite material layer 101. The electromagnetic shielding layer 103 is omitted by doping the electromagnetic shielding material 102 in the composite material layer 101. The electromagnetic shielding layer 103 is generally of a nano-scale thickness, which has little influence on the overall thickness of the support layer 10 with a micron-scale thickness, but the thickness of the support layer 10 can also be reduced to some extent.

In this example, the overall film thickness of the support layer 10 and the terminal device 1 can be reduced by reducing or removing the electromagnetic shielding layer 103.

In an example, the support layer may also be provided with a SUS layer.

The SUS layer and the composite material layer 101 are disposed in a stacked manner.

It can be understood that the composite material layer 101 can reduce the weight and cost of the support layer, and improve the shielding effect. The elastic modulus of the supporting layer 10 can be further improved by disposing a SUS layer, and the supporting effect can be improved to some extent.

In an example, the support layer 10 further includes a plasma-contact layer 90 disposed on one side of the composite material layer 101 close to the display panel 20, and/or on another side of the composite material layer 101 away from the display panel 20.

In an example, the support layer 10 faces towards one side of the display panel 20, and/or the support layer 20 faces away from one side of the display panel 20 and is disposed as a roughened surface.

Figure 6:
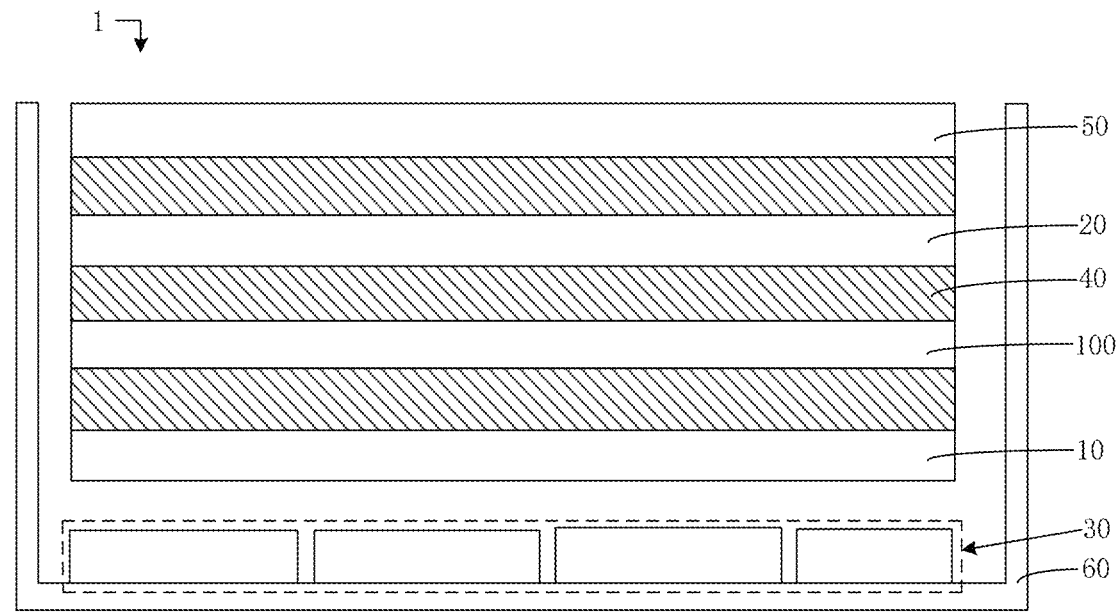
FIG. 6 is a first cross-sectional schematic view of a terminal device according to the present disclosure.

With reference to FIG. 6, a terminal device 1 according to an example of the present disclosure includes a support layer 10 and a display panel 20 according to any one of the above examples, and an electronic component layer 30. The display panel 20 and the electronic component layer 30 are respectively located on both sides of the support layer 10. The support layer 10 includes a composite material layer 101 that acts as a support and the composite material layer 101 is prepared from a composite material including at least a resin matrix and a fiber material.

The composite material has a density of less than 7.8 g/cm$^3$.

A PET base plate 100 is further disposed on one side of the display panel 20 away from the cover plate 50, and the PET base plate 100 is connected to the display panel 20 through an optical adhesive 40.

The PET base plate 100 is disposed on one side of the support layer 10 facing towards the display panel 20.

The electronic component layer 30 includes a processor, a communication chip, a power supply chip, and other components.

The support layer 10 and the display panel 20 are bonded through an optical adhesive 40.

Further, a cover plate 50 is further disposed on one side of the display panel 20 away from the support layer 10, and the cover plate 50 and the display panel 20 may be bonded through an optical adhesive 40.

The terminal device 1 further includes an intermediate frame 60, and the electronic component layer 30 may be disposed on one side of the intermediate frame 60 facing towards the display panel 20.

It can be understood that the electronic component layer 30 will generate more electromagnetic signals, which will interfere with the display panel 20 located on one side of the support layer 10 away from the electronic component layer 30, resulting in poor display. Therefore, the support layer 10 located between the electronic component layer 30 and the display panel 20 needs to play the role of shielding electromagnetic signals and avoiding interference between them.

In this example, the support layer 10 is located between the display panel 20 and the electronic component layer 30, which has the effect of preventing electromagnetic signals of the electronic component layer 30 from interfering with display of the display panel 20.

In an example, the composite material layer 101 includes a first region $A_1$ corresponding to the electronic component layer 30 in a film thickness direction, and a second region $A_2$ not corresponding to the electronic component layer 30, wherein a doping concentration of the electromagnetic shielding material in the first region $A_1$ is greater than a doping concentration of the electromagnetic shielding material in the second region $A_2$.

In this example, the composite material layer 101 in a region corresponding to the electronic component layer 30 is doped with an electromagnetic shielding material with a higher density, so that shielding effect of the position corresponding to the electronic component layer 30 is improved.

In an example, in the terminal device 1, one side of the support layer 10 in contact with the optical adhesive 40 is roughened.

The support layer 10 and the display panel 20 are bonded by the optical adhesive 40.

It can be understood that since a composite material with a tensile strength similar to that of a SUS material and an elastic modulus satisfying the requirement is adopted, and the bonding force between the composite material and the optical adhesive 40 is lower than that between the SUS material and the optical adhesive 40, so the bonding force can be improved by increasing the contact area between the support layer 10 and the optical adhesive 40.

In this example, the contact area is increased by roughening surface of the side where the support layer 10 is in contact with the optical adhesive 40, so that the bonding force between the support layer 10 and the optical adhesive 40 is increased, thereby preventing peeling or peeling of the film layer between the support layer 10 and the optical adhesive 40.

In an example, with reference to FIG. 7, in the terminal device 1, the support layer 10 further includes a plasma-contact layer 90, which is disposed on one side of the composite material layer 101 close to the display panel 20.

The plasma-contact layer 90 is in surface contact with the optical adhesive 40.

It can be understood that the bonding force between the support layer 10 and the optical adhesive 40 is enhanced by disposing the plasma-contact layer 90.

In this example, the plasma-contact layer 90 is disposed on one side of the support layer 10 facing towards the optical adhesive 40, so that peeling or peeling of the film layer between the support layer 10 and the optical adhesive 40 is prevented.

With reference to FIG. 8, an example of the present disclosure further provides a method for preparing a support layer 10, which includes:

S1: Uniformly mixing particles having high electromagnetic shielding materials 102 and molding auxiliary agents in a resin by mechanical stirring to prepare a resin containing the electromagnetic shielding materials 102; and S2: Preparing fiber composite materials according to a commonly used preparation process of fiber composite materials.

The commonly used preparation process of fiber composite materials includes a vacuum molding process or a resin transfer molding process.

The fiber composite material may be at least one of a glass fiber composite material, a carbon fiber composite material, and a Kevlar fiber composite material.

The auxiliary agents used include curing agents, diluenting agents and flexibilizers, or the like, where the diluenting agents may increase the overall flowability of the solution.

The resin may be a flexible resin material, such as an epoxy resin, an unsaturated polyester resin, or the like.

It can be understood that the flexibility of the composite material can be improved by using a flexible resin material, thereby facilitating the flexible bending of the support layer 10 and the terminal device 1.

In one example, the bonding strength is increased by plasma gas treatment or chemical etching treatment or physical etching on one or both sides of the composite material layer 101.

Physical etching may be a laser etching, or may be another physical etching method capable of improving the surface roughness or the contact area of the composite material layer.

The plasma-contact layer 90 can be formed by plasma gas treatment.

The purpose of chemical etching or physical etching is to roughen the contact surface between the composite material layer 101 and the optical adhesive 40, thereby improving the bonding force.

It can be understood that the bonding force between surface of the composite material layer 101 and the optical adhesive 40 is increased by plasma gas treatment or chemical etching before bonding the support layer 10 and the display panel 20 through the optical adhesive 40.

In this example, the bonding force between surface of the composite material layer 101 and the optical adhesive 40 is increased, so as to prevent the phenomenon that the film layer falls off or peels off between the composite material layer 101 and the optical adhesive 40 in the terminal equipment.

Figure 9:
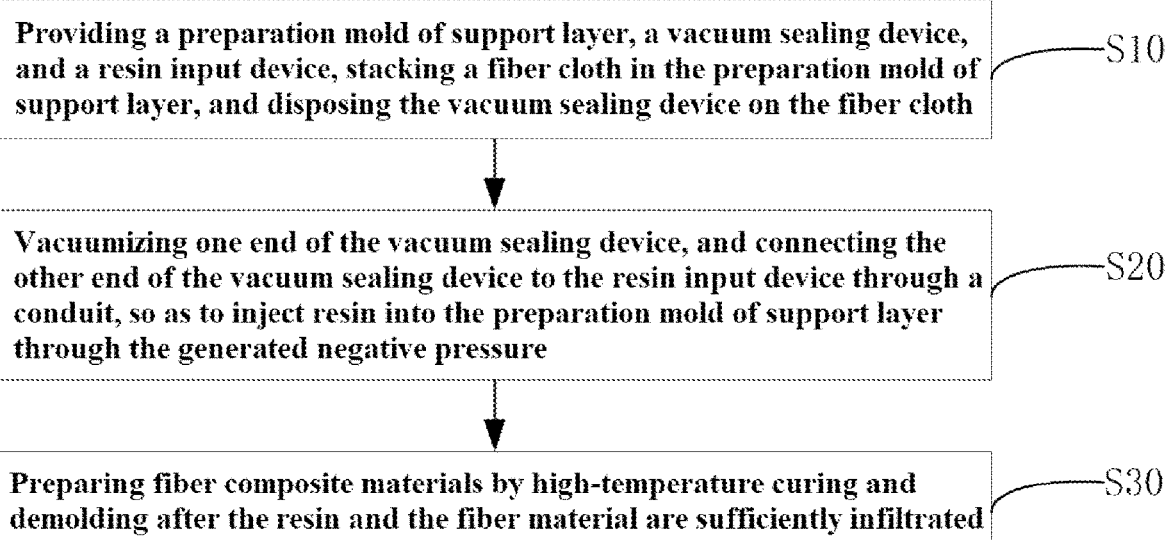
FIG. 9 is a flowchart of a vacuum forming process according to the present disclosure.

With reference to FIG. 9, an example of the present disclosure further provides a vacuum molding process, which comprises:

S10: Providing a preparation mold of support layer 10, a vacuum sealing device, and a resin input device, stacking a fiber cloth in the preparation mold of support layer 10, and disposing the vacuum sealing device on the fiber cloth;

S20, Vacuuming one end of the vacuum sealing device, and connecting the other end of the vacuum sealing device to the resin input device through a conduit, so as to inject resin into the preparation mold of support layer 10 through the generated negative pressure; and S30: Preparing fiber composite materials by high-temperature curing and demoulding after the resin and the fiber material are sufficiently infiltrated.

The fiber may be at least one of a glass fiber, a carbon fiber, and a Kevlar fiber.

Said sufficient infiltration is carried out for about 30 minutes, so that the fibers are sufficiently mixed with the resins.

The temperature range of high-temperature curing is related to the resin materials, for example, when the resin material is an epoxy resin, it has a molding temperature of about 120° C. When the resin material is an unsaturated resin, it has a molding temperature of about 60° C.

Figure 10:
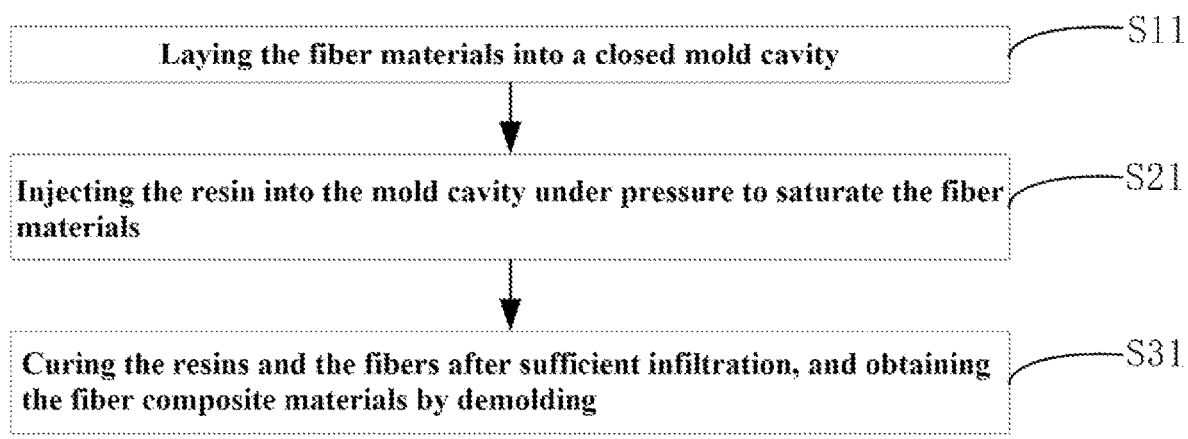
FIG. 10 is a flowchart of a resin transfer molding process according to the present disclosure.

With reference to FIG. 10, an example of the present disclosure also provides a resin transfer molding process, which includes:

S11: Laying the fiber materials into a closed mold cavity;

S21, injecting the resin into the mold cavity under pressure to saturate the fiber materials; and S31: curing the resins and the fibers after sufficient infiltration, and obtaining the fiber composite materials by demoulding.

The closed mold cavity refers to the space between a female mold and a male mold.

The demoulding process refers to a process of separating the female mold and the male mold and separating a finished product from the mold.

Examples of the present disclosure provide a display module including a support layer, a backplane, and a display panel, wherein the backplane is disposed above the support layer, and the display panel is disposed on one side of the backplane away from the support layer. The support layer includes a composite material layer that acts as a support, and the composite material layer is prepared from a composite material including at least a resin matrix and a fiber material. Compared with support layer prepared from a SUS material, support layer in the present disclosure is prepared from a composite material with a density smaller than that of the SUS material, the weight of the support layer is reduced, and the technical problem that existing display module has a greater weight of support layer is alleviated.

In the above-mentioned examples, the description of each example has its own focus. For parts that are not described in detail in an example, please refer to related descriptions of other examples.

The display module, support layer, and terminal device provided in the examples of the present disclosure are described in detail. The principles and embodiments of the present disclosure are described by using specific examples herein. Descriptions of the above examples are merely intended to help understand the technical solutions and core ideas of the present disclosure. Meanwhile, for a person skilled in the art, it is still possible to change the specific embodiments and the scope of application according to the idea of the present disclosure. In view of the above, the contents of the specification should not be construed as limiting the present disclosure.

What is claimed is:

1. A display module, comprising: a support layer, a PET base plate and a display panel, wherein the PET base plate is disposed above the support layer, the display panel is disposed on one side of the PET base plate away from the support layer, the support layer comprises a composite material layer that acts as a support, the composite material layer is prepared from a composite material, and the composite material comprises at least a resin matrix and a fiber material;

wherein the composite material layer is doped with an electromagnetic shielding material.

2. The display module according to claim 1, wherein the composite material has a density of less than 7.8 g/cm$^3$.

3. The display module according to claim 1, wherein the composite material has a tensile strength greater than or equal to that of a steel used stainless material.

4. The display module according to claim 1, wherein the fiber material is at least one of a glass fiber material and a carbon fiber composite material.

5. The display module according to claim 1, wherein the composite material layer is further doped with other functional materials comprising at least one of a light blocking material, a heat insulating material, a stress buffering material, and a crack conduction blocking material.

6. The display module according to claim 1, wherein the electromagnetic shielding material is a material with a shielding effect better than that of nickel.

7. The display module according to claim 1, wherein the electromagnetic shielding material comprises at least one of a ferrite powder, a carbonyl iron powder, a carbon black, and a nickel powder.

8. The display module according to claim 1, wherein the support layer further comprises a film layer having at least one function of blocking light, insulating heat, buffering stress, and blocking crack conduction.

9. The display module according to claim 1, wherein the support layer comprises a bending region and a non-bending region, and the composite material layer disposed in the bending region is provided with a plurality of grooves with depths less than or equal to a thickness of the composite material layer.

10. The display module according to claim 9, wherein the bending region comprises a bending center line, and a density of the plurality of grooves disposed in a region close to the bending center line is greater than a density of the plurality of grooves disposed in a region close to the non-bending region.

11. The display module according to claim 10, wherein a spacing distance between adjacent two of the plurality of grooves can be increased in a direction from the bending center line toward the non-bending region.

12. The display module according to claim 9, wherein each of the plurality of grooves is filled with a buffering material having a flexibility greater than that of the composite material.

13. The display module according to claim 1, wherein the support layer further comprises a plasma-contact layer disposed on one side of the composite material layer close to the display panel, and/or on another side of the composite material layer away from the display panel.

14. The display module according to claim 1, wherein the support layer faces towards one side of the display panel, and/or the support layer faces away from one side of the display panel, and at least one side of the support layer is configured as a roughened surface.

15. The display module according to claim 1, wherein a thickness of the support layer ranges from 100 microns to 200 microns.

16. The display module according to claim 1, wherein the support layer further comprises a SUS layer disposed in a stacked manner with the composite material layer.

17. A terminal device comprising a display module and an electronic component layer, wherein the display module comprises a support layer, a PET base plate and a display panel, the PET base plate is disposed above the support layer, the display panel is disposed on one side of the PET base plate away from the support layer, the support layer comprises a composite material layer that acts as a support, the composite material layer is prepared from a composite material, and the composite material comprises at least a resin matrix and a fiber material; and wherein the electronic component layer is disposed on one side of the support layer away from the display panel, wherein the support layer comprises a composite material layer that acts as a support, the composite material layer is prepared from a composite material, and the composite material comprises at least a resin matrix and a fiber material.

18. The terminal device according to claim 17, wherein the composite material layer comprises a first region corresponding to the electronic component layer in a film thickness direction, and a second region not corresponding to the electronic component layer, wherein a doping concentration of an electromagnetic shielding material in the first region is greater than a doping concentration of the electromagnetic shielding material in the second region.

19. The display module according to claim 1, wherein the support layer further comprises an electromagnetic shielding layer disposed on one side of the composite material layer.

20. A display module, comprising: a support layer, a PET base plate and a display panel, wherein the PET base plate is disposed above the support layer, the display panel is disposed on one side of the PET base plate away from the support layer, the support layer comprises a composite material layer that acts as a support, the composite material layer is prepared from a composite material, and the composite material comprises at least a resin matrix and a fiber material;

wherein the support layer comprises a bending region and a non-bending region, and the composite material layer disposed in the bending region is provided with a plurality of grooves with depths less than or equal to a thickness of the composite material layer.

* * * * *